US011092505B2

(12) United States Patent
van Dommelen et al.

(10) Patent No.: US 11,092,505 B2
(45) Date of Patent: Aug. 17, 2021

(54) SENSOR PACKAGE AND A METHOD OF MANUFACTURING A SENSOR PACKAGE

(71) Applicant: Sencio B.V., Nijmegen (NL)

(72) Inventors: Ignatius Josephus van Dommelen, Vorstenbosch (NL); Johannes Mathias Nicolaas Pleumeekers, Beuningen (NL)

(73) Assignee: Sendo B.V., Nijmegen (NL)

(*) Notice: Subject to any disclaimer, the term of this patent is extended or adjusted under 35 U.S.C. 154(b) by 177 days.

(21) Appl. No.: 16/404,776

(22) Filed: May 7, 2019

(65) Prior Publication Data

US 2019/0346327 A1 Nov. 14, 2019

(30) Foreign Application Priority Data

May 9, 2018 (NL) ...................................... 2020901

(51) Int. Cl.
*G01L 19/00* (2006.01)
*G01L 19/14* (2006.01)
*G01L 19/06* (2006.01)

(52) U.S. Cl.
CPC ........ *G01L 19/141* (2013.01); *G01L 19/0618* (2013.01)

(58) Field of Classification Search
CPC ............................. G01L 19/00; G01L 19/141
See application file for complete search history.

(56) References Cited

U.S. PATENT DOCUMENTS

| | | | | |
|---|---|---|---|---|
| 6,229,190 B1 * | 5/2001 | Bryzek | ................. | G01L 9/0042 257/254 |
| 8,035,208 B2 * | 10/2011 | Raben | ................. | H01L 23/3107 257/680 |
| 8,502,151 B2 * | 8/2013 | Yao | ........................ | G01S 7/4813 250/338.4 |
| 9,006,847 B2 * | 4/2015 | Welter | ................ | G01L 19/0627 257/417 |
| 9,939,300 B2 * | 4/2018 | Asano | ................... | G01F 1/6965 |
| 10,060,819 B2 * | 8/2018 | Vaupel | ................... | G01L 19/147 |
| 10,386,216 B2 * | 8/2019 | Ogata | ........................ | G01F 1/69 |
| 2006/0001116 A1 * | 1/2006 | Auburger | .............. | B81B 7/0067 257/433 |
| 2008/0236278 A1 * | 10/2008 | Theuss | ................. | G01D 11/245 73/431 |
| 2009/0102033 A1 * | 4/2009 | Raben | ................. | H01L 23/3107 257/676 |
| 2012/0112365 A1 * | 5/2012 | Ausserlechner | ........ | H01L 24/49 |

(Continued)

FOREIGN PATENT DOCUMENTS

| | | |
|---|---|---|
| WO | 00/37912 A1 | 6/2000 |
| WO | 2012/110994 A1 | 8/2012 |
| WO | WO-2012110994 A1 * | 8/2012 ......... H01L 31/0203 |

*Primary Examiner* — Jamel E Williams
(74) *Attorney, Agent, or Firm* — N.V. Nederlandsch Octrooibureau; Catherine A. Shultz; Katelyn J. Bernier (57) ABSTRACT

A sensor package 1 includes a sensor carrier 2 with a sensor element 4, a pre-moulded tray part 10 with an exposed cavity 12, the sensor carrier 2 with the sensor element 4 being positioned in a recess 21 of the pre-moulded tray part 10 part to extend into the exposed cavity 12. A lead frame 6 is arranged to provide external connections of the sensor package 1, an over-moulding package part 8, arranged around the lead frame 6 and the pre-moulded tray part 10 and having an aperture 12a aligned with the exposed cavity 12.

13 Claims, 4 Drawing Sheets

(56) References Cited

U.S. PATENT DOCUMENTS

| | | | |
|---|---|---|---|
| 2014/0151697 A1* | 6/2014 | Ausserlechner | H01L 25/16 |
| | | | 257/48 |
| 2014/0360262 A1* | 12/2014 | Asano | G01F 1/6842 |
| | | | 73/204.19 |
| 2020/0072692 A1* | 3/2020 | Otte | G01L 9/0054 |
| 2020/0075466 A1* | 3/2020 | Chen | H01L 24/73 |

\* cited by examiner

SENSOR PACKAGE AND A METHOD OF MANUFACTURING A SENSOR PACKAGE

FIELD OF THE INVENTION

The present invention relates to a sensor package comprising a sensor carrier with a sensor element. In a further aspect, the present invention relates to a method of manufacturing such a sensor package.

BACKGROUND ART

European patent publication EP-A-2 051 298 discloses an integrated circuit package built on a lead frame, having a through hole in two major surfaces of the package. In the through hole a sensor element is positioned. The sensor element is attached to a ring part which is held by the package mould material.

SUMMARY

Sensor packages typically comprise components for sensing together with components that are used for control and interfacing. Some of these components can contain sensitive or fragile parts, which need to be protected if operated in harsh environments. In addition to harsh environments that typically arise from high pressures, high temperatures or from the presence of (corrosive) fluids, there can be also sudden external forces involved. If not properly packed or sealed, these sudden external forces can damage the functionalities of components as they cannot withstand such sudden forces beyond a certain limit. The present invention seeks to provide a sensor package comprising a sensor carrier with a sensor element, which can operate in such harsh environments.

According to an embodiment, a sensor package is provided as defined above, further comprising a pre-moulded tray part with an exposed cavity, the sensor carrier with the sensor element being positioned in a recess of the pre-moulded tray part to extend into the exposed cavity, a lead frame arranged to provide external connections of the sensor package, and an over-moulding package part, arranged around the lead frame and the pre-moulded tray part and having an aperture aligned with the exposed cavity.

With such an arrangement, only the sensor element and the moulding compounds of the pre-moulded tray and over-moulding package part are being exposed to the harsh environment. In this manner, any fragile, metallic or even outgassing components of the sensor package are properly sealed from the hostile environment.

A further aspect relates to a method of manufacturing a sensor package as defined above. The method comprises providing a lead frame; forming a pre-moulded tray part with an exposed cavity and a recess, positioning a sensor carrier with a sensor element in the recess of the pre-moulded tray part to extend into the exposed cavity, forming an over-moulding package part by applying over-moulding material around the lead frame and the pre-moulded tray part, and providing an aperture aligned with the exposed cavity.

Such a method allows for a cost effective manufacturing of a sensor package that can be used in harsh environments. The two stage moulding method also ensures that the sealing around the sensing elements is performed without excessive flash or bleed of the moulding compound and prevents the exposed cavity being filled with moulding compound.

Further embodiments are described by the following description and dependent claims.

SHORT DESCRIPTION OF DRAWINGS

The present invention will be discussed in more detail below, with reference to the attached drawings, in which.

DESCRIPTION OF EMBODIMENTS

The present invention embodiments relate to a sensor package comprising a sensor carrier with a sensor element. The sensor package can comprise any type of sensor such as a pressure sensor, a temperature sensor, a viscosity sensor or even a multi-parameter sensor. The sensor can be made of any material, depending on the application for which it will be used. For the present invention embodiments, the sensor package is very suitable for housing a pressure sensor, which is subjected to very high pressures during operation (in the order of tens of even hundreds of bar). However, it is noted that the description of exemplary embodiments with a pressure sensor is not intended to limit the scope of the claims as appended.

The present invention embodiments of the sensor package 1, and the method embodiments for manufacturing such a sensor package 1, are specifically suited for sensor applications requiring operation in a harsh environment, e.g. wherein the sensor of the sensor package 1 is exposed to high pressures (and associated high pressure gradients) in a fluid for which certain parts of existing sensor packages are sensitive to deterioration etc., such as sealing material, glue etc.

Figure 1:
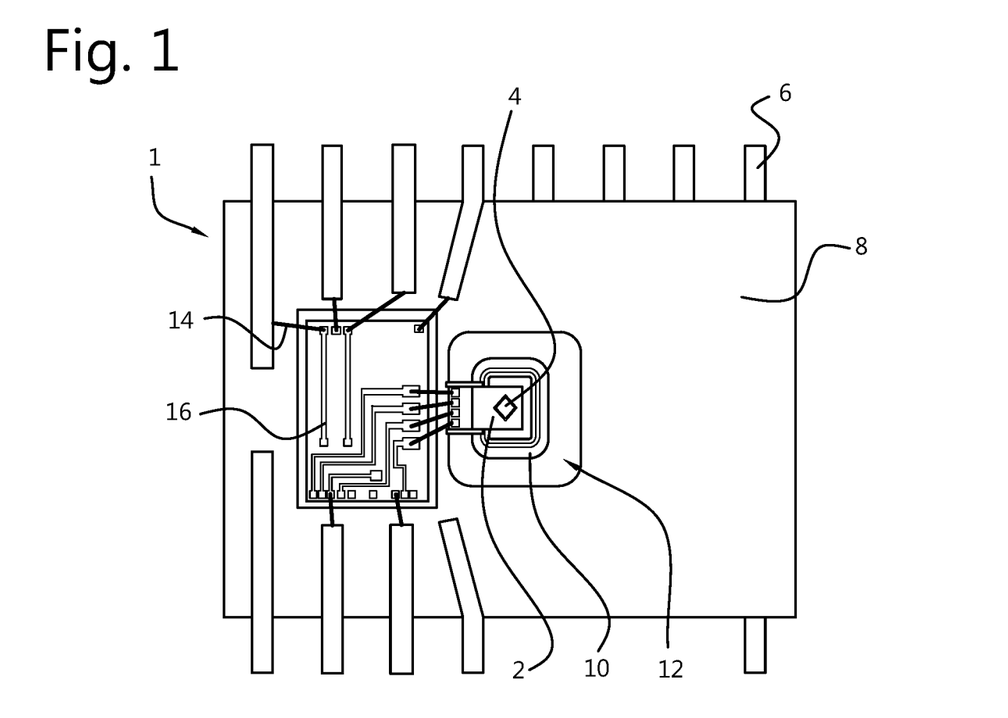
FIG. 1 shows a schematic cross sectional view of a sensor package according to an embodiment of the present invention.

FIG. 1 shows a cross sectional top view of the sensor package 1, according to a first embodiment of the present invention. The sensor package 1 comprises a sensor carrier 2 with a sensor element 4, a pre-moulded tray part 10 with an exposed cavity 12. The sensor carrier 2 with the sensor element 4 is positioned in a recess 21 of the pre-moulded tray part 10 to extend into the exposed cavity 12. A lead frame 6 is present and arranged to provide external connections of the sensor package 1. Finally an over-moulding package part 8 is provided, arranged around the lead frame 6 and the pre-moulded tray part 10 and having an aperture 12a aligned with the exposed cavity 12.

The sensor package 1 comprises the sensor carrier 2 with a sensor element 4. The sensor carrier 2 can be designed to have any geometry such as rectangular, trapezoidal or cylindrical. The embodiment as shown in FIG. 1 has a sensor carrier 2 with a rectangular cross section and the sensor element 4 is placed on the upper surface at the proximal end of the sensor carrier 2. The sensor element 4 can be either attached to or integrated with the sensor carrier 2. The lead frame 6 is functionally arranged to provide external connections of the sensor package 1, and to function as support or base of components and elements inside the sensor package 1. The lead frame 6 can have external connection wires or connection pads which are placed on any or on all the sides of the sensor package.

The sensor package 1 comprises a pre-moulded tray part 10 with an exposed cavity 12. In other words, the pre-moulded tray part 10 defines the exposed cavity 12 wherein the sensor element 4 is positioned. The pre-moulded tray part 10 (and exposed cavity 12) can also be designed in various geometries, e.g. generally rectangular as shown in FIG. 1, or circular. The sensor element 4 is advantageously placed at the centre of the exposed cavity 12. As shown in FIG. 1, the exposed cavity 12 can also have curved corners.

In addition, the cross sectional view of the FIG. 1 embodiment shows that an integrated circuit 16 (or more generically processing electronics) can be present, supported by the lead frame 6, and connected to the sensor carrier 2 and external package connection parts of the lead frame 6 using electrical connections 14 (e.g. wire bonds). Furthermore, the over-moulding package part 8 is also shown in the FIG. 1 embodiment, as providing the main part of the sensor package 1.

Figure 2:
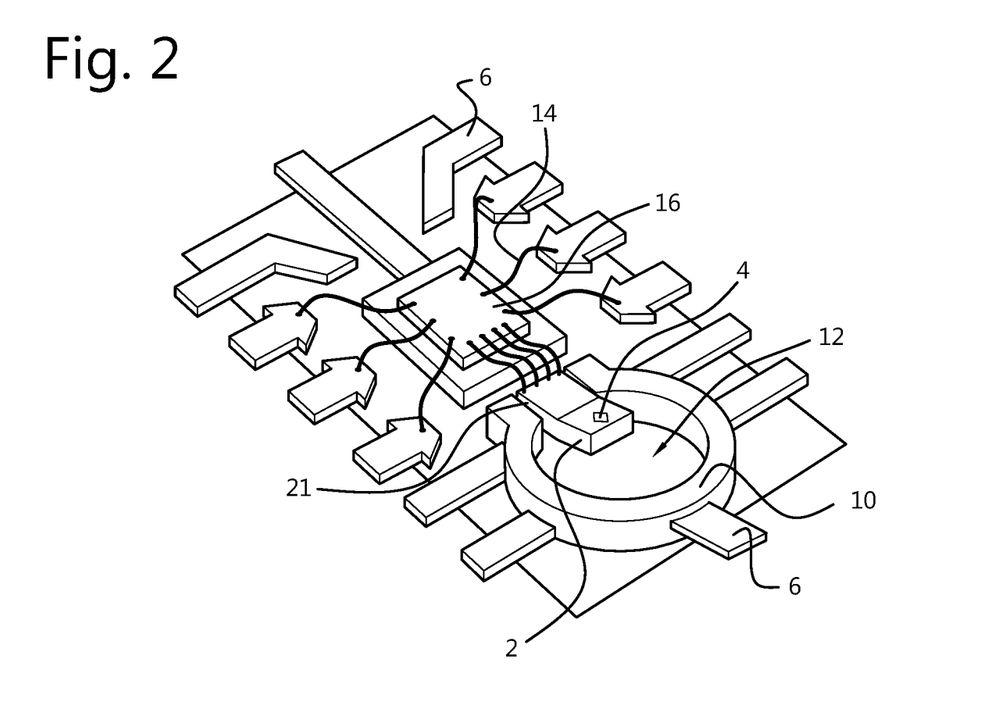
FIG. 2 shows a perspective view of a sensor package before over-moulding according to a further embodiment of the present invention.

FIG. 2 shows a perspective view of a partially manufactured sensor package 1 with the pre-moulded tray part 10 attached to the lead frame 6, but before the over-moulding package part 8 has been formed. The sensor carrier 2 with the sensor element 4 is positioned in a recess 21 of the pre-moulded tray part 10 to extend into the exposed cavity 12. The pre-moulded tray part 10 is attached to the lead frame 6 such that the lead frame 6 acts as a carrier for the pre-moulded tray part 10. After positioning the sensor carrier 2 in the recess 21, the electrical connections 14 are being made from top surface of the distal end of the sensor carrier 2 to the integrated circuit 16 and/or to the external package connection parts of the lead frame 6. The electrical connections 14 are e.g. made using wire bonding.

The sensor element 4 and the sensor carrier 2 are kept stress-free within the pre-moulded tray part 10. If the sensor carrier 2 would be under stress in the sensor package 1, e.g. due to a temperature gradient developed within the material or materials of the sensor carrier 2 during manufacturing of the sensor package 1, then the sensor carrier 2 can mechanically deform, which can affect the functionality and/or accuracy of the sensor element 4. It can also affect a precise positioning of the sensor element 4 at the centre of the sensor package 1, and even operational performance of the sensor package 1 may be negatively influenced. If the exposed cavity 12 is designed with a rectangular geometry, then the width and length of the exposed cavity 12 are chosen e.g. depending on the width and length of the sensor carrier 2 (and/or the sensor element 4). The exposed cavity 12 can be designed to be placed at the centre of the sensor package 1. This central positioning may have advantages for operational use, as it is easier to precisely position the (bigger) sensor package 1 when it is ascertained the sensor element 4 is exactly positioned in the center of the exposed cavity 12.

For applications in high pressure sensing by the sensor package 1 it is advantageous to have the exposed cavity 12 as small as possible. The exposed cavity 12 can be designed to have a small size, in the order of 1 or 2 $mm^2$, e.g. having a width of 1.4 mm and a length of 1.8 mm. The pre-moulded tray part 10 and the exposed cavity 12 provided therein can alternatively be designed to have a circular shape, which will ensure that the externally applied pressure is equally distributed around the sensor element 4.

The present invention embodiments are specifically suited for applications using a pressure sensor as sensor element 4 for measuring burst pressures typically in the order of magnitude of 120 to 220 bar (and a temperature range from −40 to 150 degree Celsius). These type of harsh environments can also involve requirements to be able to withstand specific fluids, such as corrosive (e.g. hydraulic) fluids. A pressure gradient in these type of applications can even be in the range of 2000 bar/ms, posing even higher requirements of robustness of the sensor package 1 construction. If a burst pressure or a sudden pressure wave occurs, the construction of the present invention embodiments ensure it will be present all around the sensor element 4. The burst pressure would create a force on sensor element 4 depending on the space in the exposed cavity 12 between the sensor carrier 2 and the pre-moulded tray 10. If a proper packaging is ensured, then the sudden pressure waves will not have serious or even any impact on the components that are sealed within the sensor package 1. The packaging ensures that only the pre-moulded tray part 10 (or better the moulding compound used therefor) and part of the sensor carrier 2 are exposed to the (hostile) environment, including any (corrosive) fluid present. In such a case, because of the construction of the sensor package 1, the fluid will be present only around the sensor element 4 within the exposed cavity 12.

Figure 3A:
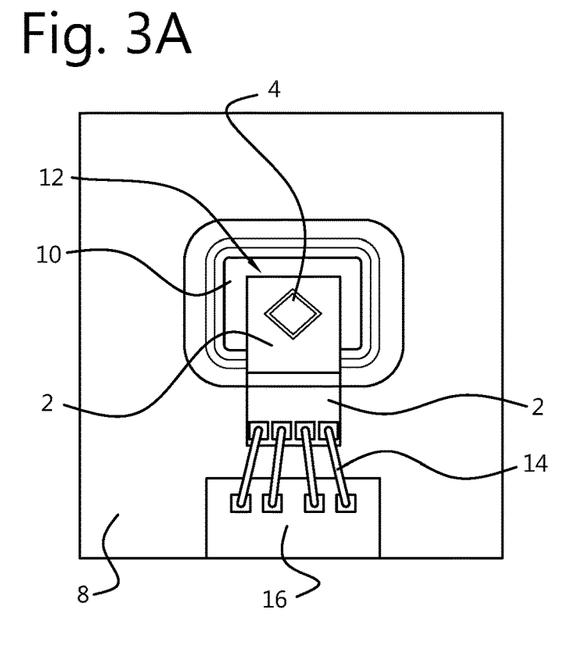
FIGS. 3A and 3B show a top view and a cross-sectional view, respectively, of a sensor package according to an even further embodiment of the present invention.
Figure 3B:
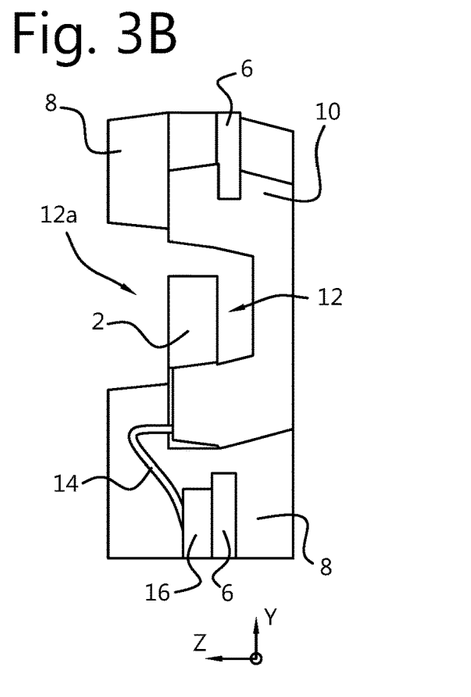

The over-moulding package part 8 is arranged around the lead frame 6 and the pre-moulded tray part 10 and has an aperture 12a aligned with the exposed cavity 12. FIG. 3A shows a top view and FIG. 3B shows a cross-sectional view of a sensor package 1, after the over-moulding has been performed, resulting in a direct binding of the over-moulding package part 8 to the pre-moulded tray part 10. The aperture 12a can be formed by over moulding, e.g. when performed with one of existing technologies, such as Film Assisted Moulding (FAM), Metal- or soft-Insert technologies. The aperture 12a is typically designed to only have a few tenths of millimetres of depth, e.g. a depth of 0.5 mm. The over moulding is performed with a moulding compound and using a stopping die. The over-moulding process forming the over-moulding package part 8 ensures that only the exposed cavity 12, aperture 12a and part of the sensor carrier 2 are exposed to the environment during operation.

The size of the exposed cavity 12 is influenced by various parameters such as the area of the exposed sensor element 4, a cavity depth, spacing between the sensor carrier 2 and the edges of the exposed cavity 12 (or inner surface of the pre-moulded tray part 10), but also process parameters such as the sealing area required for the over moulding process, a required release angle, etc. The mould arrangement as used will define the sealing area required for the over moulding, i.e. the surface rim on the upper surface of the pre-mould tray part 10 necessary to have sufficient sealing during the over moulding process without material getting into the exposed cavity 12. For proper release of the sensor package 1 out of the mould, the mould should have a proper release angle in relation to the depth of the aperture 12a.

In a specific embodiment of the present invention, the aperture 12a has a cross sectional area larger than a cross sectional area of the exposed cavity 12. The aperture 12a and the exposed cavity 12 which during operation provide the access to the sensor element 4 then have a low risk of port blocking. The difference in cross section area will provides the (small) rim at the circumference of the pre-moulded tray part 10, necessary to sufficiently seal off the exposed cavity 12 during over-moulding, i.e. a $2^{nd}$ stage moulding step using e.g. a stopper to create the aperture 12a in the over-moulding package part 8.

As an example, the minimum cavity size of the sensor package 1 can be calculated as follows. The depth of the aperture 12a can be in the order of tenths of millimetres, e.g. 0.5 mm and the release angle can be in the order of a few degrees, e.g. 7 degrees. The exposed sensor area (sensor element 4) can have a size typically in the order of hundreds of micrometres, e.g. a length of 800 μm and a width of 700 μm. The spacing between sensor carrier 2 and an edge of the exposed cavity 12 is e.g. 150 μm. The sealing area required for the over moulding process can also be in the order of a few hundreds of micrometres, e.g. 175 μm on each side. The distance needed due to the required release angle is e.g. 61 μm on each side. The rounded corners of the pre-moulded tray part 10 may give an additional reduction in size of the exposed cavity volume. The rounded corners can have a radius of e.g. 200 μm. The total cavity size can then obtained by adding up all distances, resulting in a minimum area of 1573 by 1323 μm, such that the pressure port area exposed is around 2 mm². If the burst pressure applied is then a maximum of 210 bar (or 21 N/mm²), the force exerted on the sensor package 1 is 4.4 kgf.

When such a force is applied to the sensor package 1 embodiment as shown in the cross sectional view of FIG. 3B, or when pressures are to be measured having a high pressure gradient, the structure of the sensor package 1, more in particular the space between sensor carrier 2 and exposed cavity 12, will determine how this is translated into a force on the sensor carrier 2. From this, the minimum dimensions of the sensor carrier 2 may be determined.

Figure 4A:
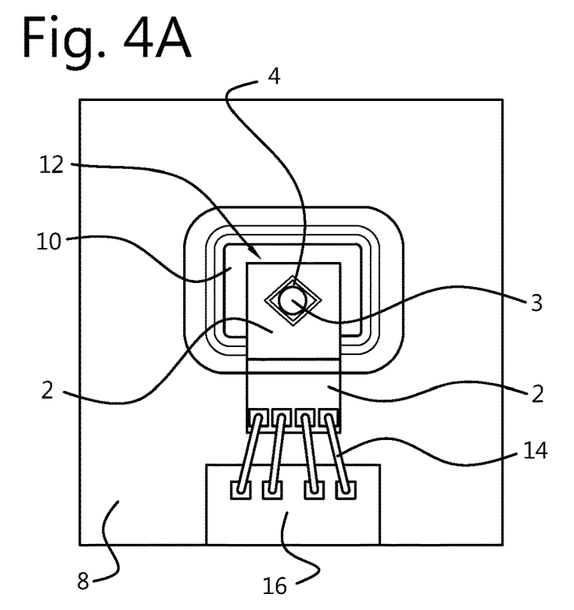
FIGS. 4A and 4B show a top view and a cross-sectional view, respectively, of a sensor package according to yet another embodiment of the present invention.
Figure 4B:
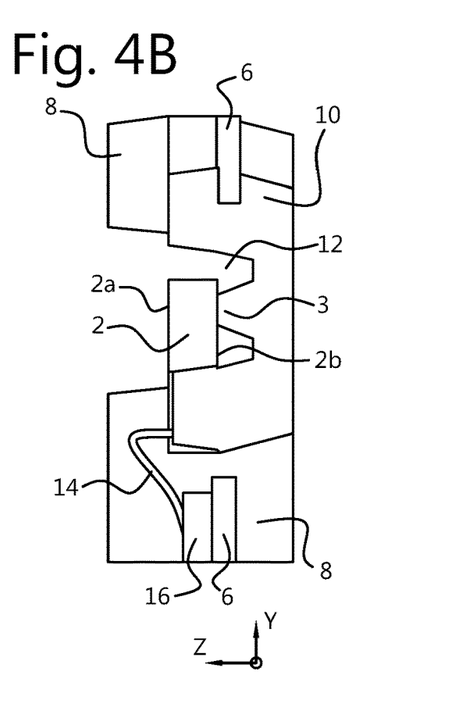

As an alternative, a further embodiment of the present invention comprises a sensor support element 3 positioned on a bottom of the exposed cavity 12 of the pre-moulded tray part 10. FIGS. 4A and 4B show a top view and a cross-sectional view, respectively, of the sensor package 1 according to this embodiment. As shown in FIGS. 4A and 4B the sensor support element 3 provides additional mechanical support to the sensor carrier 2. This additional support ensures that the sensor carrier 2 and the sensor element 4 do not have any stress formation which can lead to deformations such as bending of the structure of the sensor carrier 2, which would inevitably result in measurement errors. The sensor support element 3 can be of any geometry such as rectangular or cylindrical.

Figure 5A:
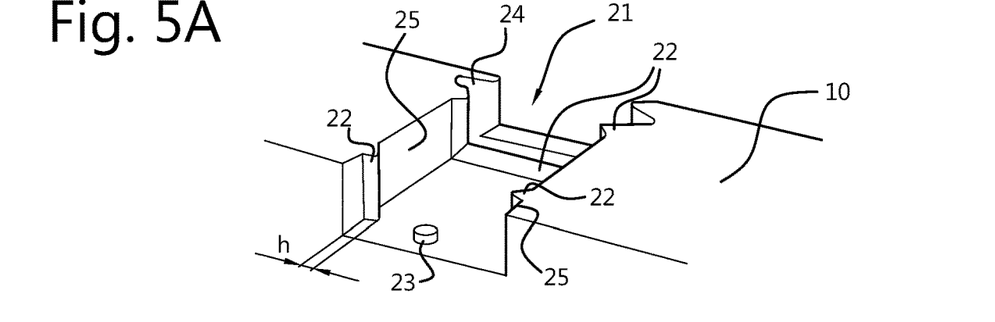
FIGS. 5A and 5B show perspective partial views of the pre-moulded tray part without and with the sensor carrier, respectively, according to an even further embodiment of the present invention.
Figure 5B:
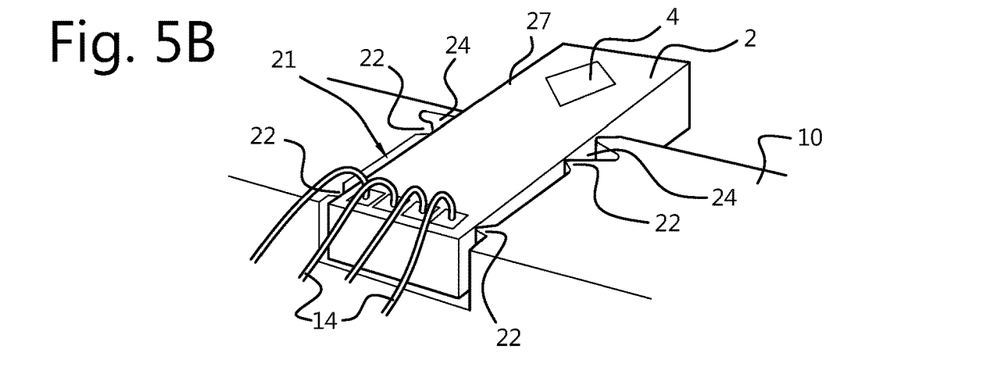

FIG. 5A shows a perspective view of the recess 21 of the pre-moulded tray part 10, before placing the sensor carrier 2. FIG. 5B shows the same perspective view of the sensor carrier 2 having the sensor element 4 positioned within the recess 21 of the pre-moulded tray part 10, but before performing the over moulding process. In some embodiments of the present invention, the recess 21 of the pre-moulded tray part 10 comprises at least one barrier 22 arranged to extend inward into the recess 21. The barrier 22 can be symmetrically or asymmetrically placed on either sides of the recess 21, i.e. proximal and distal from the exposed cavity 12. The barrier 22 can also be placed only one side of the recess 21, i.e. the side most close to the exposed cavity 12. Additionally, one or more barriers 22 can be placed on the base of the recess 21 as shown in the embodiment of FIG. 5A. The recess 21 can be manufactured by several methods, including various moulding techniques, or alternative methods such as physical or chemical etching of the material of the pre-moulded tray 10 in a selective manner.

The barrier(s) 22 will assist to hold the sensor carrier 2 in a predefined position in the recess 21 during the over moulding process, and ensure that there is a void between the pre-moulded tray 10 (i.e. surface of the recess 21) and the sensor carrier, allowing fluid over moulding material (before curing) to flow around the sensor carrier 2 to seal off the extending part of the sensor carrier 2 inside the exposed cavity 12. During the over moulding process, the barrier(s) 22 will also cause a pressure drop around the barrier 22 towards the exposed cavity 12. In combination with the small dimensions between barrier(s) 22 and sensor carrier 2 this will cause filler materials from the over mould compound to aggregate, and as a result block and stop any further bleeding of the filler material (especially also the epoxy part in the over moulding compound.

The space or gap between the recess 21 of the pre-moulded tray part 10 and the sensor carrier 2 is minimized as the over moulding compound need to creep through this space a bit. Thus, the over-moulding compound has to fill through the side gaps and the bottom gap between the walls of the recess 21 and the sensor carrier 2. Typically these gaps are designed to be only few micrometres in size, and by properly selecting the dimension range of filler material in the over moulding compound, the moulding compounds can bleed or blow out just sufficient to form a proper sealing.

During the over-moulding step, the compound fills all around the sensor carrier 2. The moulding compound typically has epoxy with fillers. Parameters such as moulding compound viscosity, venting of trapped air, and design of the exposed cavity 12 are also considered for designing the size of the gap between the recess 21 of the pre-moulded tray part 10 and the sensor carrier 2. As mentioned, the gap provides space between the sensor carrier 2 and the recess 21 where over-moulding compound can flow in. This also allows to create a pressure drop during the over-moulding process in the direction of the exposed cavity 12. Eventually during the over-moulding process, the space between the barrier 22 and the sensor carrier 2 is filled with filler materials of larger size, thus preventing the epoxy to bleed through. In some embodiments of the present invention, the at least one barrier 22 has an extension height h of at least 1 μm (see FIG. 5A. Thus, even though the gap between sensor carrier 2 and the recess 21 is minimised, sufficient gap is maintained to allow the over-moulding compound to flow through initially.

In a further embodiment of the present invention the recess 21 of the pre-moulded tray part 10 comprises one or more spacers 23. As shown in FIG. 5A, the spacers 23 can be combined with one or more barriers 22 on the base surface of the recess 21. The spacers 23 can be of few micrometres in height. The spacers 23 create a sufficient space below the sensor carrier 2 that allows the over-moulding compound to fill all around the sensor carrier 2, in an efficient manner. Additionally, the spacers 23 can be also used for aligning the sensor carrier 2 with respect to the recess 21. The spacers 23 can be of any geometry such as an elliptical spacer as shown in FIG. 5A.

In a further embodiment of the present invention, the recess 21 of the pre-moulded tray part 10 further comprises an expansion space 24, arranged proximal to the exposed cavity 12 with respect to the at least one barrier 22. The expansion space 24 ensures to maintain an anti-flash profile during the over moulding process. The filler material of the over moulding compound e.g. have a size distribution of 5-75 μm. The larger particles will block the space between recess 21 and sensor carrier 2, but the smaller particles and epoxy will keep on flowing to the lower pressure environment of the expansion space 24. Thus, the expansion space 24 eventually creates a bleed stop, resulting in having no flash. When the space between the sensor carrier 2 and the exposed cavity 24 is smaller than the maximum particle size of the filler material of the over moulding compound, these will block the pathway to the expansion space 24. Thus only a bleed will happen by epoxy coming through. When the exposed area of the epoxy is expanded during the over-moulding process, a bleed stop will be created to stop the flow of epoxy further.

Figure 6A:
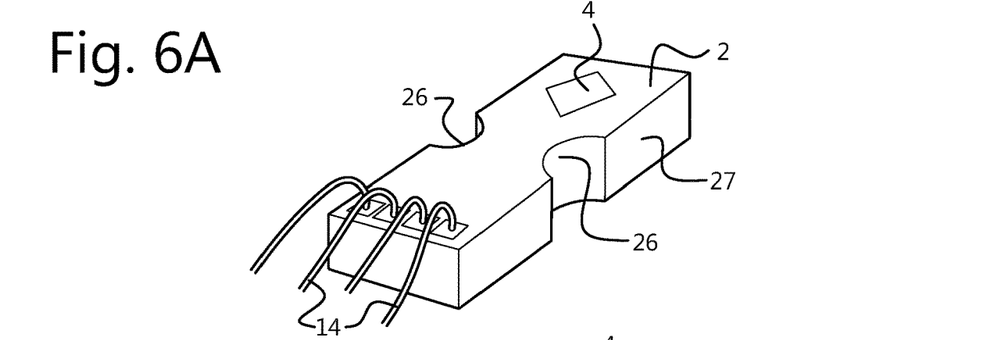
FIGS. 6A and 6B show perspective partial views of the pre-moulded tray part without and with the sensor carrier, respectively, according to yet a further embodiment of the present invention.
Figure 6B:
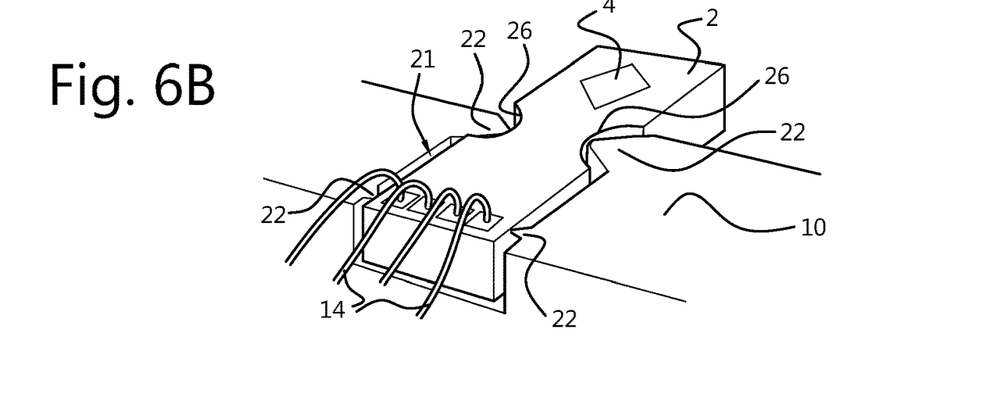

Yet another embodiment of the present invention relates to a sensor package 1 wherein the sensor carrier 2 is provided with an indentation 26 at a side wall 27 of the sensor carrier 2. This is an alternative way of creating an expansion space for the over-moulding step. FIG. 6A shows a perspective view of the sensor carrier 2 having indentations 26 on both side walls. FIG. 6B shows a perspective view wherein the sensor carrier 2 having indentations 26 is positioned within the recess 21 of the pre-moulded tray part 10. During a manufacturing step such as an etching process, well-defined indentations 26 can be created on one or either sides of the sensor carrier 2 (which is typically of silicon material). The indentation 26 can be defined as small as only few micrometres in size. By having indentations 26 created on the sensor carrier 2, the sensor carrier 2 can be positioned more accurately within the exposed cavity 12. If the sensor carrier 2 is made up of materials such as silicon, the etching process of silicon can be defined with as low as only a few micrometres of accuracy.

Figure 7A:
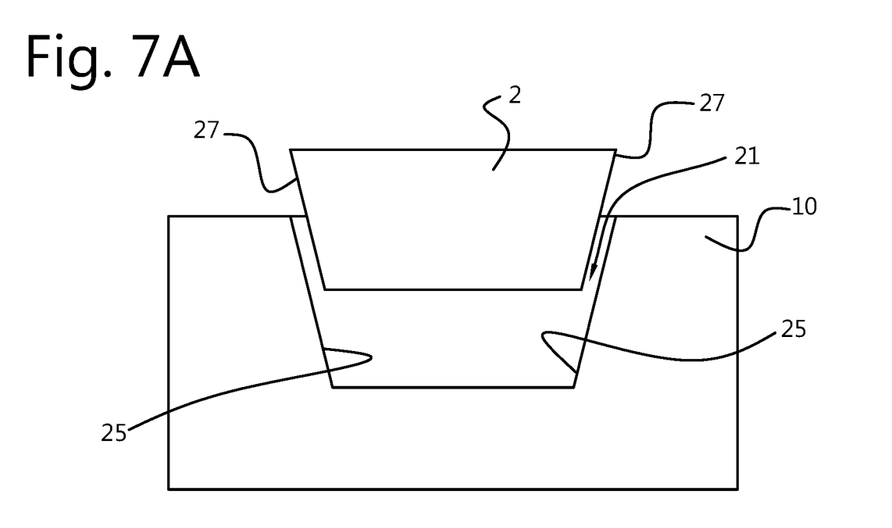
FIGS. 7A and 7B show cross sectional views of the recess with the sensor carrier according to an even further embodiment of the present invention.
Figure 7B:
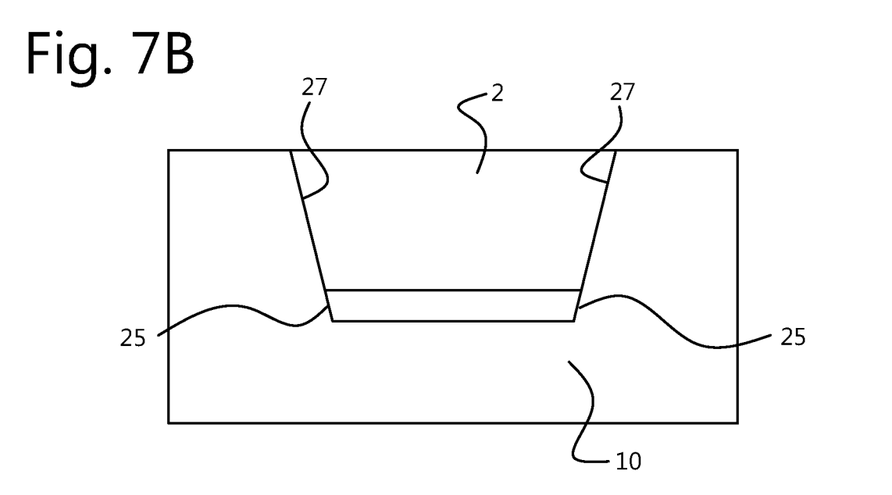

FIGS. 7A and 7B show a cross sectional view of the sensor carrier 2 and the recess portion 21 according to another embodiment of the present invention. In one embodiment of the present invention, the recess 21 and the sensor carrier 2 comprise congruent sloping walls 25; 27. The congruent walls 25; 27 can be realised by having a sensor carrier 2 with a trapezium shape. If the sensor carrier 2 is made up of silicon, then the etching planes of silicon can be utilised for defining these well-defined sloping walls. The same release angle can be used in moulding of the recess 21 of the pre-moulded tray 10. As a result there will be only a defined area at the bottom side once the sensor carrier 2 is positioned in the recess 21 of the pre-moulded tray part 10, which can easily be filled during the over moulding process. This also ensures increased ease of properly placing the sensor carrier 2 within the pre-moulded tray part 10.

As described above with reference to FIG. 1, another embodiment of the present invention, comprises an integrated circuit 16 positioned on the lead frame 6, and electrical connections 14 between the integrated circuit and the sensor carrier 2, wherein the integrated circuit 16 and electrical connections 14 are covered by the over-moulding package part 8. The integrated circuit 16 can be an Application Specific Integrated Circuit (ASIC), or another type of processing circuitry. The integrated circuit 16 can be placed on the lead frame 6 and be part of the sensor package 1 connected by wire bonding. In such a case, the over-moulding process also moulds the integrated circuit 16, thus being protected from the environment. Alternatively, only the sensor carrier 2 with sensor element 4 is part of the sensor package, directly connected to the external connection parts of the lead frame 6. The possibly needed processing circuitry 16 or the ASIC can then be part of a separate IC package outside the sensor package 1. The electrical connections can be made by using bonding wires. The integrated circuit 16 can be of any one of various types, having example dimensions of 1×1 to 4×4 mm, which would allow placement of the integrated circuit 16 together with a centrally positioned sensor element 4 in a regular 16 lead sensor package 1.

In a further embodiment of the present invention, a moulding compound of the pre-moulded tray part 10 comprises a filler material having smaller dimensions than a filler material of a moulding compound of the over-moulding package part 8. Typically filler material for forming the over-moulding package part 8 has particles with dimensions larger than the gap in the recess 21 between the sensor carrier 2 and the one or more barriers 22. The filler material having smaller dimensions for the pre-mould 10 ensures that pre-mould 10 can have more accurate small dimensional shapes needed to make an accurately shaped recess 21.

A further aspect of the present invention relates to a method of manufacturing a sensor package 1, comprising providing a lead frame 6; forming a pre-moulded tray part 10 with an exposed cavity 12 and a recess 21, positioning a sensor carrier 2 with a sensor element 4 in the recess 21 of the pre-moulded tray part 10 to extend into the exposed cavity 12, forming an over-moulding package part 8 by applying over-moulding material around the lead frame 6 and the pre-moulded tray part 10, and providing an aperture 12a aligned with the exposed cavity 12. The method of manufacturing can be performed in an automated manner where several steps can be performed in a parallel processing implementation. The method of manufacturing can also be performed in a matrix frame, e.g. using a 32 piece lead frame 6, 48 piece lead frame 6, or e.g. a 16 piece lead frame 6 in the case of application of the present invention embodiments in SOIC. The method of manufacturing the sensor package 1 can be performed for the manufacture of any one of the sensor package 1 embodiments described in this description.

In an even further embodiment of the present invention the pre-moulded tray part 10 is formed using a first moulding compound, and the over-moulding package part 8 is formed using a second moulding compound, wherein the second moulding compound comprises filler material having larger dimensions than filler material of the first moulding compound. The first moulding compound with filler material of smaller dimensions allows the pre-mould to withstand high pressure gradients such as up to 2000 bar/ms, and the second moulding compound with filler material of larger dimensions allows to stop bleeding of filler material into the exposed cavity 12.

The present invention has been described above with reference to a number of exemplary embodiments as shown in the drawings. Modifications and alternative implementations of some parts or elements are possible, and are included in the scope of protection as defined in the appended claims.

The invention claimed is:

1. A sensor package comprising:
   a sensor carrier with a sensor element,
   a pre-moulded tray part with an exposed cavity, the sensor carrier with the sensor element being positioned in a recess of the pre-moulded tray part to extend into the exposed cavity,
   a lead frame arranged to provide external connections of the sensor package,
   an over-moulding package part, arranged around the lead frame and the pre-moulded tray part and having an aperture aligned with the exposed cavity, wherein the recess of the pre-moulded tray part comprises at least one barrier arranged to extend inward into the recess.

2. The sensor package according to claim 1, wherein the at least one barrier has an extension height (h) of at least 1 µm.

3. The sensor package according to claim 1, wherein the recess of the pre-moulded tray part comprises one or more spacers.

4. The sensor package according to claim 1, wherein the recess of the pre-moulded tray part further comprises an expansion space, arranged proximal to the exposed cavity with respect to the at least one barrier.

5. The sensor package according to claim 1, wherein the sensor carrier is provided with an indentation at a side wall of the sensor carrier.

6. The sensor package according to claim 1, wherein the recess and the sensor carrier comprise congruent sloping walls.

7. The sensor package according to claim 1, wherein the aperture has a cross sectional area larger than a cross sectional area of the exposed cavity.

8. The sensor package according to claim 1, further comprising a sensor support element positioned on a bottom of the exposed cavity of the pre-moulded tray part.

9. The sensor package according to claim 1, further comprising an integrated circuit positioned on the lead frame, and electrical connections between the integrated circuit and the sensor carrier, wherein the integrated circuit and electrical connections are covered by the over-moulding package part.

10. The sensor package according to claim 1, wherein a moulding compound of the pre-moulded tray part comprises a filler material having smaller dimensions than a filler material of a moulding compound of the over-moulding package part.

11. A method of manufacturing a sensor package, the method comprising providing a lead frame;
forming a pre-moulded tray part with an exposed cavity and a recess, wherein the recess of the pre-moulded tray part comprises at least one barrier arranged to extend inward into the recess;
positioning a sensor carrier with a sensor element in the recess of the pre-moulded tray part to extend into the exposed cavity,
forming an over-moulding package part by applying over moulding material around the lead frame and the pre-moulded tray part, and providing an aperture aligned with the exposed cavity.

12. The method according to claim 11, wherein the pre-moulded tray part is formed using a first moulding compound, and the over-moulding package part is formed using a second moulding compound.

13. The method of claim 12, wherein the second moulding compound comprises filler material having larger dimensions than filler material of the first moulding compound.

* * * * *

UNITED STATES PATENT AND TRADEMARK OFFICE
CERTIFICATE OF CORRECTION

PATENT NO. : 11,092,505 B2
APPLICATION NO. : 16/404776
DATED : August 17, 2021
INVENTOR(S) : Ignatius Josephus van Dommelen and Johannes Mathias Nicolaas Pleumeekers Page 1 of 1

It is certified that error appears in the above-identified patent and that said Letters Patent is hereby corrected as shown below:

On the Title Page

Item (73) Assignee: Should read: Sencio B.V., Nijmegen (NL)

Signed and Sealed this
Eighth Day of March, 2022

Drew Hirshfeld
*Performing the Functions and Duties of the
Under Secretary of Commerce for Intellectual Property and
Director of the United States Patent and Trademark Office*